(12) United States Patent
Hirose et al.

(10) Patent No.: US 8,716,703 B2
(45) Date of Patent: May 6, 2014

(54) ORGANIC SEMICONDUCTOR TRANSISTOR

(75) Inventors: Hidekazu Hirose, Kanagawa (JP); Koji Horiba, Kanagawa (JP); Katsuhiro Sato, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 170 days.

(21) Appl. No.: 13/482,673

(22) Filed: May 29, 2012

(65) Prior Publication Data

US 2013/0161589 A1    Jun. 27, 2013

(30) Foreign Application Priority Data

Dec. 26, 2011    (JP) ................................. 2011-283931

(51) Int. Cl.
*H01L 35/24*    (2006.01)
(52) U.S. Cl.
USPC .................................... 257/40; 257/E51.001
(58) Field of Classification Search
USPC ........................................... 257/40, E51.001
See application file for complete search history.

(56) References Cited

U.S. PATENT DOCUMENTS

| | | |
|---|---|---|
| 5,574,291 A | 11/1996 | Dodabalapur et al. |
| 5,596,208 A | 1/1997 | Dodabalapur et al. |
| 5,659,181 A | 8/1997 | Bridenbaugh et al. |
| 5,946,551 A | 8/1999 | Dimitrakopoulos et al. |
| 5,981,970 A | 11/1999 | Dimitrakopoulos et al. |
| 6,107,117 A | 8/2000 | Bao et al. |
| 6,210,479 B1 | 4/2001 | Bojarczuk et al. |
| 6,278,127 B1 | 8/2001 | Dodabalapur et al. |
| 6,344,660 B1 | 2/2002 | Dimitrakopoulos et al. |
| 6,344,662 B1 | 2/2002 | Dimitrakopoulos et al. |

FOREIGN PATENT DOCUMENTS

| | | |
|---|---|---|
| JP | A-5-55568 | 3/1993 |
| JP | A-5-190877 | 7/1993 |
| JP | A-8-228034 | 9/1996 |
| JP | A-8-228035 | 9/1996 |
| JP | A-8-264805 | 10/1996 |
| JP | A-10-125924 | 5/1998 |
| JP | A-10-190001 | 7/1998 |
| JP | A-10-270712 | 10/1998 |
| JP | A-2000-174277 | 6/2000 |
| JP | A-2001-94107 | 4/2001 |

OTHER PUBLICATIONS

Drury, C.J. et al., "Low-cost all-polymer integrated circuits," *Applied Physics Letters*, Jul. 6, 1998, pp. 108-110, vol. 73, No. 1.

*Primary Examiner* — Anthony Ho
(74) *Attorney, Agent, or Firm* — Oliff PLC

(57) ABSTRACT

Provided is an organic semiconductor transistor including plural electrodes, and an organic semiconductor layer containing at least one fluorene compound represented by the following formula (I):

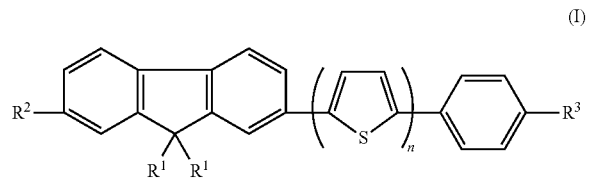

wherein $R^1$ represents an alkyl group having from 1 to 8 carbon atoms; $R^2$ and $R^3$ each independently represent an alkyl group having from 1 to 8 carbon atoms, or an alkoxy group having from 1 to 8 carbon atoms; and n represents an integer of from 1 to 3.

3 Claims, 2 Drawing Sheets

ORGANIC SEMICONDUCTOR TRANSISTOR

CROSS-REFERENCE TO RELATED APPLICATIONS

This application is based on and claims priority under 35 USC 119 from Japanese Patent Application No. 2011-283931 filed Dec. 26, 2011.

BACKGROUND

1. Technical Field

The present invention relates to an organic semiconductor transistor.

2. Related Art

Thin film transistors are widely used as switching elements for display, such as liquid crystal display elements. Thin film transistors have been traditionally produced by using amorphous or polycrystalline silicon.

Meanwhile, in recent years, studies on organic semiconductors that are represented by organic electroluminescence (EL) elements and the like, have been actively conducted. Along with the studies, there have been reports on the research to incorporate organic substances into circuits instead of silicon materials by taking advantage of characteristics such as light weight and flexibility.

SUMMARY

According to a first aspect of the present invention, there is provided an organic semiconductor transistor including:
plural electrodes; and
an organic semiconductor layer containing at least one fluorene compound represented by the following formula (I):

$$\text{(I)}$$

wherein in the formula (I), $R^1$ represents an alkyl group having from 1 to 8 carbon atoms; $R^2$ and $R^3$ each independently represent an alkyl group having from 1 to 8 carbon atoms, or an alkoxy group having from 1 to 8 carbon atoms; and n represents an integer of from 1 to 3.

BRIEF DESCRIPTION OF THE DRAWINGS

Exemplary embodiments of the present invention will be described in detail based on the following figures, wherein.

DETAILED DESCRIPTION

Figure 1:
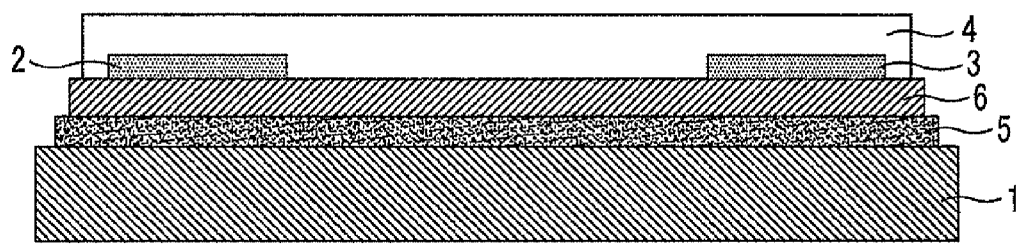
FIG. 1 is a schematic configuration diagram showing an example of the layer configuration of the organic semiconductor transistor of the exemplary embodiment.

Hereinafter, the exemplary embodiment of the present invention will be described in detail. Furthermore, the present invention is not intended to be limited by any action or function speculated in the present specification.

The organic semiconductor transistor of the present exemplary embodiment includes plural electrodes, and an organic semiconductor layer containing at least one fluorene compound represented by the following formula (I).

In an organic semiconductor transistor including an organic semiconductor layer using a fluorene compound represented by the formula (I), a decrease in the charge mobility is suppressed, and size enlargement is realized as compared with organic semiconductor transistors including organic semiconductor layers that use poly(3-hexylthiophene).

A reason for this is considered to be as follows.

First, since the fluorene compound represented by the formula (I) has an alkyl group or an alkoxy group as $R^2$ and $R^3$ that may be considered to impart solubility, at both ends of an asymmetric skeleton in which a thiophene ring is linked to only one end of the fluorene skeleton, it is believed that the hindrance caused by the alkyl group or alkoxy group, which causes a decrease in charge mobility, is suppressed.

Accordingly, the fluorene compound may be considered to have excellent solubility in organic solvents that are generally used in the manufacture of electronic devices, while suppressing the decrease in the charge mobility caused by an alkyl group or an alkoxy group.

That is, it is thought that the compound represented by the formula (I) is a compound which achieves a good balance between the suppression of a decrease in charge mobility and excellent solubility.

Meanwhile, in the present specification, the term "thiophene ring" means a thiophene ring group or plural thiophene rings linked to each other.

In an organic semiconductor layer using the fluorene compound represented by the formula (I), since the fluorene compound represented by the formula (I) has excellent solubility as described in the above, the organic semiconductor layer may be realized by a wet system (so-called wet process) using a solution prepared by dissolving the compound in an organic solvent.

It is contemplated that in the organic semiconductor layer thus obtained, since the solubility of the fluorene compound represented by the formula (I) in organic solvents is high, even if the organic semiconductor layer is subjected to size enlargement, defects in film formation, such as cracks, fissures and chips, are suppressed.

As discussed above, in the organic semiconductor transistor according to the exemplary embodiment, size enlargement is realized while a decrease in charge mobility is suppressed.

Furthermore, in the organic semiconductor transistor according to the exemplary embodiment, since the fluorene compound represented by the formula (I) has excellent film-forming properties, and thus the formation of an organic semiconductor layer is realized by a wet process, the formation of an organic semiconductor layer on a flexible substrate is also realized, and as a result, the provision of a flexible organic semiconductor transistor is also realized.

Hereinafter, the fluorene compound represented by the following formula (I) will be described in detail, and then the organic semiconductor transistor of the exemplary embodiment will be described.

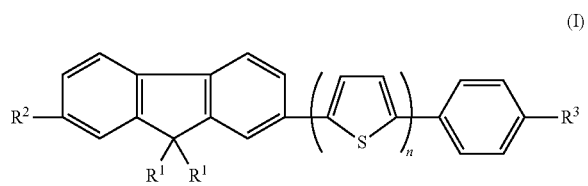

(I)

In the formula (I), $R^1$ represents an alkyl group having from 1 to 8 carbon atoms; $R^2$ and $R^3$ each independently represent an alkyl group having from 1 to 8 carbon atoms, or an alkoxy group having from 1 to 8 carbon atoms; and n represents an integer of from 1 to 3.

In the formula (I), the alkyl group represented by $R^1$ is an alkyl group having from 1 to 8 carbon atoms (preferably, from 3 to 6 carbon atoms), and specific examples include a methyl group, an ethyl group, an n-propyl group, an isopropyl group, an n-butyl group, a t-butyl group, a pentyl group and a hexyl group. The alkyl group represented by $R^1$ may be linear or may be branched.

In the formula (I), the alkyl group represented by $R^2$ is an alkyl group having from 1 to 8 carbon atoms (preferably, from 3 to 6 carbon atoms), and specific examples include a methyl group, an ethyl group, an n-propyl group, an isopropyl group, an n-butyl group, a t-butyl group, a pentyl group, a hexyl group, a heptyl group and an octyl group. The alkyl group represented by $R^2$ may be linear or may be branched.

In the formula (I), the alkoxy group represented by $R^2$ is an alkoxy group having from 1 to 8 carbon atoms (preferably, from 3 to 6 carbon atoms), and specific examples include a methoxy group, an ethoxy group, an n-propoxy group, an isopropyl group, an n-butoxy group, a t-butoxy group, and a pentyloxy group. The alkoxy group represented by $R^2$ may be linear or may be branched.

In the formula (I), the alkyl group represented by $R^3$ is an alkyl group having from 1 to 8 carbon atoms (preferably, from 3 to 6 carbon atoms), and specific examples include a methyl group, an ethyl group, an n-propyl group, an isopropyl group, an n-butyl group, a t-butyl group, a pentyl group, a hexyl group, a heptyl group, and an octyl group. The alkyl group represented by $R^3$ may be linear or may be branched.

In the formula (I), the alkoxy group represented by $R^3$ is an alkoxy group having from 1 to 8 carbon atoms (preferably, from 3 to 6 carbon atoms), and specific examples include a methoxy group, an ethoxy group, an n-propoxy group, an isopropyl group, an n-butoxy group, a t-butoxy group, and a pentyloxy group. The alkoxy group represented by $R^3$ may be linear or may be branched.

In the formula (I), $R^2$ and $R^3$ may represent identical groups, or may represent different groups. However, from the viewpoints of solubility and film-forming properties, it is preferable that $R^2$ and $R^3$ represent different groups.

In the formula (I), n represents an integer of from 1 to 3, but is preferably from 2 to 3.

Specific examples of the fluorene compound represented by the formula (I) will be shown below, but the specific examples are not limited to these. Meanwhile, the numbers in the column "Structure No." indicate the numbers of the compounds listed as specific examples.

| Structure No. | $R^1$ | $R^2$ | $R^3$ | n |
|---|---|---|---|---|
| 1 | —$CH_3$ | —$CH_3$ | —$CH_3$ | 1 |
| 2 | —$CH_3$ | —$CH_3$ | —$CH_3$ | 2 |
| 3 | —n-$C_3H_7$ | —$CH_3$ | —n-$C_3H_7$ | 1 |
| 4 | —n-$C_6H_{13}$ | —$CH_3$ | —n-$C_3H_7$ | 1 |
| 5 | —$CH_3$ | —O—$CH_3$ | —n-$C_3H_7$ | 2 |
| 6 | —n-$C_6H_{13}$ | —O—$CH_3$ | —n-$C_6H_{13}$ | 1 |
| 7 | —$CH_3$ | —n-$C_3H_7$ | —n-$C_6H_{13}$ | 1 |
| 8 | —$CH_3$ | —n-$C_3H_7$ | —n-$C_6H_{13}$ | 3 |
| 9 | —n-$C_3H_7$ | —n-$C_3H_7$ | —n-$C_6H_{13}$ | 1 |
| 10 | —$CH_3$ | —O-n-$C_3H_7$ | —n-$C_3H_7$ | 1 |
| 11 | —$CH_3$ | —n-$C_3H_7$ | —n-$C_3H_7$ | 2 |
| 12 | —$CH_3$ | —O-n-$C_3H_7$ | —n-$C_3H_7$ | 2 |
| 13 | —n-$C_3H_7$ | —O-n-$C_3H_7$ | —n-$C_6H_{13}$ | 1 |
| 14 | —n-$C_3H_7$ | —O-n-$C_3H_7$ | —n-$C_6H_{13}$ | 2 |
| 15 | —n-$C_6H_{13}$ | —n-$C_3H_7$ | —n-$C_6H_{13}$ | 1 |
| 16 | —n-$C_6H_{13}$ | —n-$C_3H_7$ | —n-$C_6H_{13}$ | 2 |
| 17 | —n-$C_6H_{13}$ | —O—n-$C_3H_7$ | —n-$C_6H_{13}$ | 2 |
| 18 | —$CH_3$ | —n-$C_6H_{13}$ | —n-$C_3H_7$ | 1 |
| 19 | —$CH_3$ | —O—n-$C_6H_{13}$ | —n-$C_3H_7$ | 1 |
| 20 | —$CH_3$ | —n-$C_6H_{13}$ | —n-$C_8H_{17}$ | 1 |
| 21 | —$CH_3$ | —n-$C_6H_{13}$ | —n-$C_8H_{17}$ | 2 |
| 22 | —$CH_3$ | —n-$C_8H_{17}$ | —n-$C_3H_7$ | 1 |
| 23 | —$CH_3$ | —n-$C_6H_{13}$ | —O-n-$C_8H_{17}$ | 1 |
| 24 | —n-$C_6H_{13}$ | —O-n-$C_6H_{13}$ | —n-$C_6H_{13}$ | 1 |
| 25 | —n-$C_6H_{13}$ | —n-$C_8H_{17}$ | —n-$C_6H_{13}$ | 1 |
| 26 | —n-$C_6H_{13}$ | —O-n-$C_8H_{17}$ | —n-$C_6H_{13}$ | 1 |
| 27 | —n-$C_6H_{13}$ | —n-$C_8H_{17}$ | —n-$C_6H_{13}$ | 2 |
| 28 | —n-$C_6H_{13}$ | —n-$C_6H_{13}$ | —n-$C_8H_{17}$ | 3 |
| 29 | —n-$C_8H_{17}$ | —n-$C_6H_{13}$ | —n-$C_8H_{17}$ | 2 |
| 30 | —$CH_3$ | —n-$C_6H_{13}$ | —t-$C(CH_3)_3$ | 1 |
| 31 | —$CH_3$ | —n-$C_6H_{13}$ | —$CH_2CH_3$ | 1 |
| 32 | —$CH_3$ | —n-$C_6H_{13}$ | —n-$C_{10}H_{21}$ | 1 |
| 33 | —$CH_3$ | —$CH_2CH_3$ | —n-$C_{10}H_{21}$ | 1 |
| 34 | —$CH_3$ | —n-$C_{10}H_{21}$ | —n-$C_8H_{17}$ | 1 |
| 35 | —n-$C_3H_7$ | —n-$C_8H_{17}$ | —n-$C_6H_{13}$ | 2 |
| 36 | —n-$C_6H_{13}$ | —n-$C_6H_{13}$ | —n-$C_6H_{13}$ | 1 |

Hereinafter, a method for producing the fluorene compound represented by the formula (I) will be described.

The fluorene compound represented by the formula (I) may be obtained by utilizing, for example, cross-coupling biaryl synthesis. The cross-coupling biaryl synthesis may use a Suzuki reaction, a Kharasch reaction, a Negishi reaction, a Stille reaction, a Grignard reaction, an Ullmann reaction, or the like. Specifically, for example, the fluorene compound may be synthesized according to the following scheme, but the synthesis method is not limited to this.

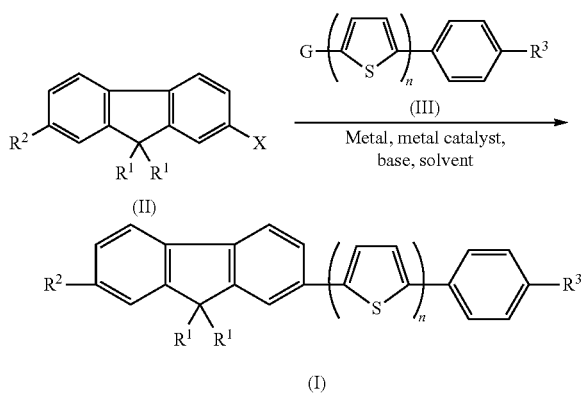

Furthermore, in the formulae (II) and (III), X and G each independently represent a halogen atom, $B(OH)_2$, a substituent represented by the following structural formula (IV-1), a substituent represented by the following structural formula (IV-2), or a substituent represented by the following structural formula (IV-3). Also, in the formulae (II) and (III), $R^1$, $R^2$, $R^3$ and n have the same meanings as defined for $R^1$, $R^2$, $R^3$ and n in the formula (I).

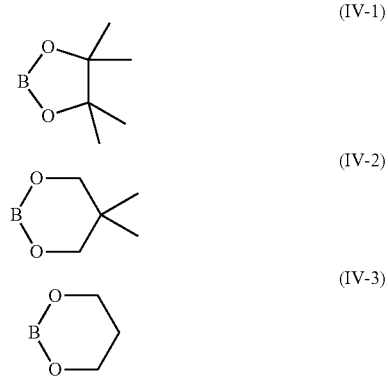

(IV-1)

(IV-2)

(IV-3)

As the metal, metal catalyst, base and solvent that may be used at the time of the synthesis reaction, the following may be used.

Examples of the metal that may be used include palladium (Pd), copper (Cu), titanium (Ti), tin (Sn), nickel (Ni), and platinum (Pt).

Examples of the metal catalyst that may be used include tetrakis(triphenylphosphine)palladium ($Pd(PPh_3)_4$), palladium(II) acetate ($Pd(OCOCH_3)_2$), tris(dibenzylideneacetone)dipalladium(0) ($Pd_2(dba)_3$), di(triphenylphosphine)dichloropalladium ($Pd(PPh_3)_2Cl_2$), 1,1'-bis(diphenylphosphino)ferrocene-palladium(II) dichloride-dichloromethane complex ($Pd(dppf)_2Cl_2$), Pd/C, and nickel (II) acetylacetonate ($Ni(acac)_2$).

Examples of the base that may be used include inorganic bases such as sodium carbonate ($Na_2CO_3$), potassium carbonate ($K_2CO_3$), cesium carbonate ($Cs_2CO_3$), and barium hydroxide ($Ba(OH)_2$); and organic bases such as triethylamine ($NEt_3$), diisopropylamine ($NH(i-Pr)_2$), diethylamine ($NHEt_2$), dimethylamine ($NHMe_2$), trimethylamine ($NMe_3$), 1,8-diazabicyclo[5.4.0]-7-undecene (DBU), N,N-dimethyl-4-aminopyridine (DMAP), and pyridine.

The solvent may be any solvent which does not significantly impede the reaction, and examples that may be used include aromatic hydrocarbon solvents such as benzene, toluene, xylene and mesitylene; ether solvents such as diethyl ether, tetrahydrofuran, and dioxane; acetonitrile, dimethylformamide, dimethyl sulfoxide, methanol, ethanol, isopropyl alcohol, and water.

Furthermore, at the time of the reaction, for example, triphenylphosphine ($PPh_3$), tri-o-tolylphosphine ($P(o-Tol)_3$), tributylphosphine ($P(t-Bu)_3$), and triethylphosphine ($PEt_3$) may be used.

Moreover, Me as used above represents "$CH_3$"; Et represents "$C_2H_5$"; Ph represents "$C_6H_5$"; i-Pr represents "$(CH_3)_2CH_2$"; o-Tol represents "$o-CH_3C_6H_4$"; and t—Bu represents "$(CH_3)_3C$".

The synthesis reaction described above is carried out, for example, at normal pressure (1 atmosphere), in an inert gas (for example, nitrogen or argon) atmosphere, but may also be carried out under pressurized conditions. Furthermore, the reaction temperature of the synthesis reaction is in the range of from 20° C. to 300° C., and more preferably in the range of from 50° C. to 180° C. The reaction time of the synthesis reaction may vary with the reaction conditions, but may be selected in the range of from several minutes to 20 hours.

In the reaction described above, the amount of the metal or metal complex catalyst used is not particularly limited, but the amount is preferably from 0.001 mol % to 10 mol %, and more preferably from 0.01 mol % to 5.0 mol %, based on the compound represented by the formula (I).

The amount of the base used is, as a molar ratio with respect to the compound represented by the formula (I), in the range of from 0.5 to 4.0, and more preferably in the range of from 1.0 to 2.5.

After the reaction described above, the reaction solution is put into water and stirred thoroughly. When the reaction product is a solid (crystals), the reaction product is collected by suction filtration, and thus a crude product is obtained. On the other hand, when the reaction product is an oily substance, the reaction product is extracted with an appropriate solvent such as ethyl acetate or toluene, and thus a crude product is obtained. Thereafter, the crude product thus obtained is purified by performing column purification (column purification using silica gel, alumina, activated white clay, activated carbon, or the like), or by performing a treatment such as adsorbing unnecessary components by adding these adsorbents into the solution. Furthermore, when the reaction product is in the form of crystals, the reaction product is purified by further recrystallizing the product from an appropriate solvent (for example, hexane, methanol, acetone, ethanol, ethyl acetate, or toluene). As such, the intended fluorene compound may be obtained.

<Organic Semiconductor Transistor>

The organic semiconductor transistor of the exemplary embodiment includes plural electrodes, and an organic semiconductor layer containing at least one fluorene compound represented by the formula (I). As long as the organic semiconductor transistor has this configuration, there are no particular limitations on the other configurations.

Hereinafter, the configuration will be described in more detail with reference to the attached drawings, but the configuration is not limited to this.

Figure 2:
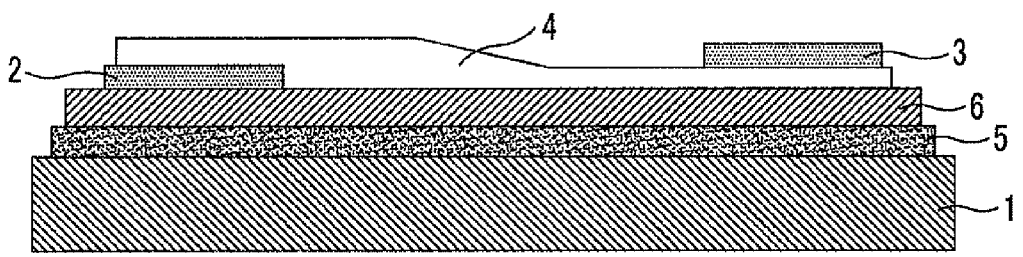
FIG. 2 is a schematic configuration diagram showing an example of the layer configuration of the organic semiconductor transistor of another exemplary embodiment.
Figure 3:
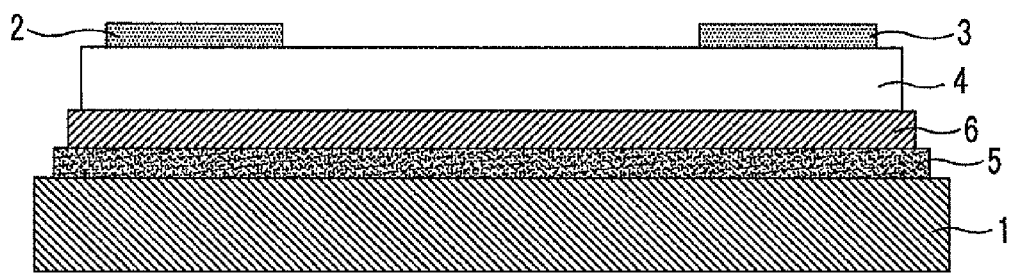
FIG. 3 is a schematic configuration diagram showing an example of the layer configuration of the organic semiconductor transistor of another exemplary embodiment.
Figure 4:
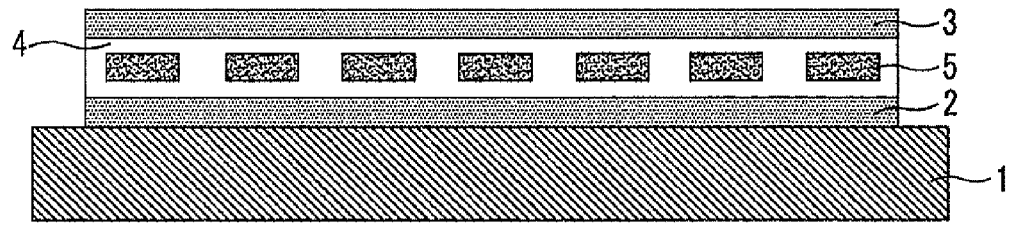
FIG. 4 is a schematic configuration diagram showing an example of the layer configuration of the organic semiconductor transistor of another exemplary embodiment.

FIG. 1, FIG. 2, FIG. 3 and FIG. 4 are cross-sectional diagrams explaining exemplary configurations of the organic semiconductor transistor of the exemplary embodiment. Here, FIG. 1, FIG. 2 and FIG. 3 show organic semiconductor transistors of field effect transistor type. Furthermore, FIG. 4 shows an organic semiconductor transistor of static induction transistor type.

The organic semiconductor transistors of field effect transistor type shown in FIG. 1, FIG. 2 and FIG. 3 each include a source electrode 2 and a drain electrode 3 that are disposed apart from each other; an organic semiconductor layer 4 that is in contact with both the source electrode 2 and the drain electrode 3; a gate electrode 5 that is separated from both the source electrode 2 and the drain electrode 3; and an insulating layer 6 that is interposed between the organic semiconductor layer 4 and the gate electrode 5.

The organic semiconductor transistor of field effect transistor type is one type of transistors that are currently used in a wide variety of applications, and advantages thereof include high speed switching operation, convenience of production method, and suitability for compact integration.

The organic semiconductor transistors of field effect transistor type shown in FIG. 1, FIG. 2 and FIG. 3 control the current flowing from the source electrode 2 to the drain electrode 3 by the voltage applied to the gate electrode 5.

The organic semiconductor transistor shown in FIG. 1 includes a gate electrode 5 on a substrate 1, and further includes an insulating layer 6 on the gate electrode 5. The transistor includes a source electrode 2 and a drain electrode 3 that are formed apart from each other on the insulating layer 6. The insulating layer 6 exposed from the source electrode and the drain electrode 3 is covered with an organic semiconductor layer 4.

The organic semiconductor transistor shown in FIG. 2 has any one of a source electrode 2 and a drain electrode 3 formed on an insulating layer 6, and has an organic semiconductor layer 4 formed to cover the source electrode 2 or drain electrode 3 formed on the insulating layer 6 and the insulating layer 6. With the organic semiconductor layer 4 being interposed between the source electrode 2 and the drain electrode 3, any one of the source electrode 2 and the drain electrode 3 that is not formed on the insulating layer is formed on the organic semiconductor layer 4.

The organic semiconductor transistor shown in FIG. 3 has an organic semiconductor layer 4 formed on an insulating layer 6, and a source electrode 2 and a drain electrode 3 are formed apart from each other on the organic semiconductor layer.

The static induction type transistor shown in FIG. 4 has a source electrode 2 and a drain electrode 3 that are disposed to face each other; an organic semiconductor layer 4 that is in contact with both the source electrode 2 and the drain electrode 3; and a gate electrode 5 that is separated from both the source electrode 2 and the drain electrode 3. That is, the transistor has a source electrode 2, an organic semiconductor layer 4 and a drain electrode 3 in this order on a substrate 1, and has plural gate electrodes 5 within the organic semiconductor layer 4. The gate electrodes 5 are disposed in the direction from the front to the back of the paper surface, in parallel to both the source electrode 2 and the drain electrode 3, such that the respective gate electrodes 5 are also in parallel to each other.

In the organic semiconductor transistor elements shown in FIG. 1, FIG. 2, FIG. 3 and FIG. 4, the current flowing from the source electrode 2 to the drain electrode 3 is controlled by the voltage applied to the gate electrode 5.

The materials used in the respective electrodes are materials intended to efficiently inject charges, and metals, metal oxides, electroconductive polymers, carbon, graphite and the like are used.

Examples of the metals used in the electrode include magnesium, aluminum, gold, silver, copper, platinum, chromium, tantalum, indium, palladium, lithium, calcium, and alloys thereof. Examples of the metal oxides include metal oxide films of lithium oxide, magnesium oxide, aluminum oxide, indium tin oxide, tin oxide, indium oxide, zinc oxide, indium zinc oxide, indium tin oxide (ITO), tin oxide (NESA), zinc oxide, and indium zinc oxide.

Examples of the electroconductive polymers used in the electrodes include polyaniline, polythiophene, polythiophene derivatives, polypyrrole, polypyridine, and complexes of polyethylenedioxythiophene and polystyrenesulfonic acid.

Meanwhile, in the exemplary embodiment of the present invention, a material being conductive means that the material has a volume resistivity in the range of $10^7$ Ωcm or lower. On the other hand, a material being insulative means that the material has a volume resistivity in the range of $10^{14}$ Ω/cm or higher.

Furthermore, the measurement of volume resistivity is carried out by applying a voltage of 100 V according to JIS-K-6911 (1995) using a circular electrode (UR probe of HIR-ESTA IP manufactured by Mitsubishi Petrochemical Co., Ltd.; outer diameter of cylindrical-shaped electrode: 416 mm, inner diameter of ring-shaped electrode unit: φ30 mm, outer diameter: φ40 mm) in an environment at 22° C./55% RH, and measuring the current value 5 seconds after the voltage application, using a microcurrent meter R8340A manufactured by Advantest Corp. The volume resistivity is determined from volume resistance, based on the current value.

The difference between the ionization potential of the material used in the drain electrode 3 and the source electrode 2, and the ionization potential of the fluorene compound represented by the formula (I) that is used in the organic semiconductor layer 4, is preferably 1.0 eV or less, and particularly preferably 0.5 eV or less, from the viewpoint of the charge injection characteristics.

When the difference in the ionization potential of these electrodes and the fluorene compound represented by the formula (I) is taken into consideration, it is preferable to use Au as the electrode material.

Meanwhile, when a substrate having electroconductivity is used, for example, in case of a silicon substrate doped at a high concentration, the substrate may also function as a gate electrode.

Examples of the method of forming an electrode include a method of manufacturing a thin film of the raw material described above according to a deposition method, a sputtering method or the like, and forming this thin film according to a known photolithographic method or a lift-off method; a method of thermally transferring aluminum or the like; and a method of forming a resist layer by inkjetting or the like, and etching this resist layer. Furthermore, an electroconductive polymer may be dissolved in a solvent, and this solution may be used for patterning by inkjetting or the like.

There are no particular limitations on the film thickness of the source electrode 2 and the drain electrode 3, but generally, the thickness is preferably in the range of from several nanometers to several hundred micrometers, more suitably from 1 nm to 100 μm, and even more suitably from 10 nm to 10 μm.

The distance (channel length) from the source electrode 2 to the drain electrode 3 is generally preferably in the range of from several hundred nanometers to several millimeters, and more suitably from 1 μm to 1 mm.

Examples of the material for the insulating layer 6 include, but are not limited to, inorganic substances such as silicon dioxide, silicon nitride, tantalum oxide, aluminum oxide, titanium oxide, tantalum oxide, tin oxide, vanadium oxide, and barium strontium titanate; and organic insulating polymers such as a polycarbonate resin, a polyester resin, a methacrylic resin, an acrylic resin, a polyvinyl chloride resin, a cellulose resin, a urethane resin, an epoxy resin, a polystyrene resin, a polyvinyl acetate resin, a styrene-butadiene copolymer, a vinylidene chloride-acrylonitrile copolymer, a vinyl chloride-vinyl acetate-maleic anhydride copolymer, and a silicone resin.

Examples of the method for forming an insulating layer of an inorganic substance include dry processes such as a vacuum deposition method, a molecular beam epitaxial growth method, an ion cluster beam method, a low energy beam method, an ion plating method, a chemical vapor deposition (CVD) method, a sputtering method, and an atmospheric plasma method; and wet processes such as various coating methods such as a spray coating method, a spin coating method, a blade coating method, an immersion coating method, a casting method, a roll coating method, a bar coating method, a die coating method, an air knife method, and an inkjet method. The method for forming an insulating layer may be selected and employed in accordance with the material used and the characteristics of the element.

As the method for forming an insulating layer using an organic insulating polymer, it is desirable to use the wet processes described above.

The thickness of the insulating layer 6 is not particularly limited, but generally, the thickness is preferably in the range of from several nanometers to several hundred micrometers, more suitably from 1 nm to 100 µm, and even more suitably from 10 nm to 10 µm.

Furthermore, the interface between the insulating layer 6 and the organic semiconductor layer 4 may be treated with, for example, a silane compound such as hexamethyldisilazane, octadecyltrimethoxysilane, octadecyltrichlorosilane, or octyltrichlorosilane, and in the case of an organic insulating layer, the interface may be treated by rubbing.

Examples of the substrate 1 include, but are not limited to, a single silicon crystal doped with phosphorus or the like at a high concentration; glass; and plastic substrates made of a polycarbonate resin, a polyester resin, a methacrylic resin, an acrylic resin, a polyvinyl chloride resin, a cellulose resin, a urethane resin, an epoxy resin, a polystyrene resin, a polyvinyl acetate resin, a styrene-butadiene copolymer, a vinylidene chloride-acrylonitrile copolymer, a vinyl chloride-vinyl acetate-maleic anhydride copolymer, and a silicone resin.

Particularly, in the case of using the organic semiconductor transistor of the exemplary embodiment of the present invention in an electronic circuit that is used in electronic paper, digital paper or portable electronic instruments, it is preferable to use a flexible substrate as the substrate 1. Particularly, driving circuits or electronic circuits of flexible display elements are produced by using a substrate having a flexural modulus of 1000 MPa or higher.

As the method for forming the organic semiconductor layer 4, various printing techniques by wet processes, such as a spin coating method, a casting method, an immersion coating method, a die coating method, a roll coating method, a bar coating method, and an inkjet method, are utilized.

As described above, since the fluorene compound represented by the formula (I) exhibits excellent solubility in organic solvents, wet processes for forming an organic semiconductor layer using a solution containing the fluorene compound dissolved therein are suitable as methods for forming an organic semiconductor containing the compound represented by the formula (I).

Examples of the solvent for the coating liquid include, but are not limited to, water; alcohols such as methanol, ethanol, isopropyl alcohol, and butanol; ketone-based solvents such as acetone, methyl ethyl ketone, methyl isobutyl ketone, and cyclohexanone; ester-based solvents such as ethyl acetate and butyl acetate; hydrocarbon-based solvents such as hexane, octane, toluene, xylene, ethylbenzene, and cumene; halogenated hydrocarbon-based solvents such as dichloromethane, chloroform, dichloroethane, tetrachloroethylene, chlorobenzene, o-dichlorobenzene, and trichlorobenzene; nitrile-based solvents such as acetonitrile, propionitrile, methoxyacetonitrile, glutarodinitrile, and benzonitrile; and aprotic polar solvents such as dimethyl sulfoxide, sulfolane, N,N-dimethylformamide, N,N-dimethylacetamide, and N-methyl-2-pyrrolidone. Furthermore, these solvents may be used individually, or plural kinds may be used in combination.

The thickness of the organic semiconductor layer 4 is not particularly limited, but generally, the thickness is preferably in the range of from several nanometers to several hundred micrometers, more suitably from 1 nm to 100 µm, and even more suitably from 5 nm to 10 µm.

Furthermore, the organic semiconductor layer 4 may be doped. As the dopant, donor-like dopants and acceptor-like dopants may all be used.

As the donor-like dopants, any compounds having a function of donating electrons to the organic compound of the organic semiconductor layer 4 may be preferably used. Examples of the donor-like dopants include alkali metals such as lithium (Li), sodium (Na), potassium (K), rubidium (Rb), and cesium (Cs); alkaline earth metals such as calcium (Ca), strontium (Sr), and barium (Ba); rare earth metals such as yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), and ytterbium (Yb); and ammonium ions.

As the acceptor-like dopants, any compounds having a function of withdrawing electrons from the organic compound of the organic semiconductor layer 4 may be preferably used. Examples of the acceptor-like dopants include halogen compounds such as $Cl_2$, $Br_2$, $I_2$, $ICl$, $ICl_3$, and $IBr$; Lewis acids such as $PF_5$, $AsF_5$, $SbF_5$, $BF_3$, $BF_3$, and $SO_3$; protic acids such as HF, HCl, $HNO_3$ and $H_2SO_4$; organic acids such as acetic acid, formic acid, and amino acids; transition metal compounds such as $FeCl_3$, $TiCl_4$, and $HfCl_4$; electrolyte anions such as $Cl^-$, $Br^-$, $I^-$, $ClO_4^-$, sulfonate anions; and organic compounds such as tetracyanoethylene, 7,7,8,8-tetracyanoquinodimethane, 11,11,12,12-tetracyanonaphtho-2,6-quinodimethane, 2,5-difluoro-7,7,8,8-tetracyanoquinodimethane, and tetrafluorotetracyanoquinodimethane.

Furthermore, a protective layer may be provided in order to prevent deterioration of the organic semiconductor transistor caused by moisture or oxygen. Specific examples of the material for the protective layer include metals such as indium (In), tin (Sn), lead (Pb), gold (Au), copper (Cu), silver (Ag) and aluminum (Al); metal oxides such as MgO, $SiO_2$, and $TiO_2$; and resins such as a polyethylene resin, a polyurea resin, and a polyimide resin. In the formation of the protective layer, a vacuum deposition method, a sputtering method, a plasma polymerization method, a chemical vapor deposition (CVD) method, or a coating method is applied.

When an electronic device is produced by using the organic semiconductor transistor of the exemplary embodiment, a configuration in which one or more of the organic semiconductor transistors of the exemplary embodiment are mounted on a substrate (semiconductor apparatus) may be used, and a desired electronic device is produced by combining this semiconductor apparatus with other elements or circuits.

EXAMPLES

Hereinafter, the present invention will be described based on Examples, but the present invention is not intended to be limited to these Examples.

In the identification of the target product, $^1$H-NMR spectroscopy ($^1$H-NMR, solvent: $CDCl_3$, UNITY-300 manufactured by VARIAN, Inc., 300 MHz), IR spectroscopy (Fourier transform infrared spectrometer (FT-730 manufactured by Horiba, Ltd., resolution 4 $cm^{-1}$) by a KBr tablet method)) are used.

Synthesis Example 1

<Synthesis of Exemplary Compound 20>

According to the following scheme, tetrakis(triphenylphosphine)palladium (2.3 g) and a 2 N aqueous sodium carbonate solution (10 ml) are added to a liquid mixture of 1-bromo-4-n-octylbenzene (25.0 g), 2-thiopheneboronic acid (10.8 g), and tetrahydrofuran (100 ml) in a nitrogen atmosphere, and the mixture is refluxed for 10 hours. After the reaction, the reaction liquid is extracted with toluene, and the organic phase is washed with pure water. Subsequently, the organic phase is dried over anhydrous sodium sulfate, and then the solvent is distilled off under reduced pressure. The residue is separated by silica gel column chromatography (hexane), and thus an intermediate 1 (26.2 g) is obtained.

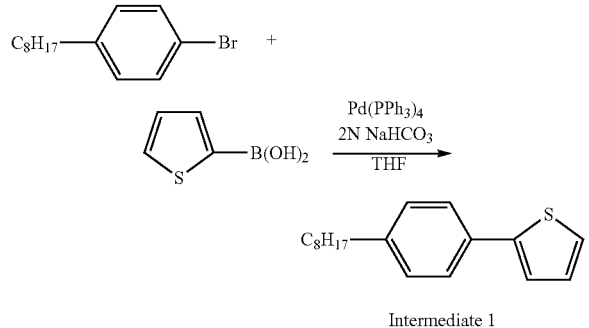

Intermediate 1

Subsequently, according to the following scheme, the intermediate 1 (26.2 g) is dissolved in N,N-dimethylformamide (100 ml), and N-bromosuccinimide (17.5 g) is added to the solution. The mixture is stirred for 18 hours. After the reaction, the reaction liquid is extracted with toluene, and the organic phase is washed with pure water. Subsequently, the organic phase is dried over anhydrous sodium sulfate, and then the solvent is distilled off under reduced pressure. Thus, an intermediate 2 (28.8 g) is obtained.

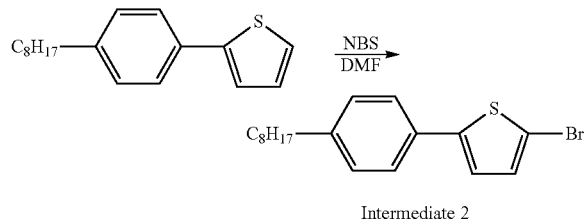

Intermediate 2

Subsequently, 65 ml of n-BuLi is put into a three-necked flask, and under a nitrogen gas stream, the flask is cooled to −78° C. in a methanol-dry ice bath. An anhydrous tetrahydrofuran (100 ml) solution containing the intermediate 2 (28.0 g) dissolved therein is added dropwise thereto over 10 minutes. The methanol-dry ice bath is removed, and the mixture is warmed and stirred for 2 hours at 35° C.

The mixture is cooled again to −78° C. in a methanol-dry ice bath, and Tri-n-butyl Borate (38.6 g) and anhydrous tetrahydrofuran (50 ml) are added thereto. The mixture is stirred for 4 hours at −78° C., Thereafter, the reaction mixture is stirred for 12 hours at room temperature (25° C.).

2 M HCl (135 ml) is added to the reaction mixture at room temperature (25° C.), and the mixture is stirred for 2 hours at room temperature (25° C.). An organic layer and an aqueous layer are separated, and the aqueous layer is extracted with ether (100 mL) 2,2-Dimethyl-1,3-propanediol (12.5 g) is added to the organic layer, the mixture is stirred, and then anhydrous sodium sulfate is added thereto. Sodium sulfate is separated by filtration, and the solvent is distilled off. Subsequently, unreacted Tri-n-butyl Borate is removed by distillation under reduced pressure, and thus an intermediate 3 (18.5 g) is obtained.

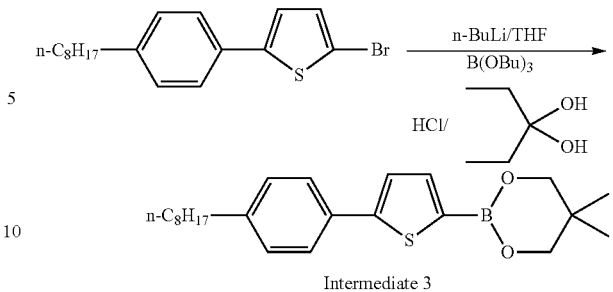

Intermediate 3

Subsequently, tetrakis(triphenylphosphine)palladium (2.4 g) and a 2 N aqueous sodium carbonate solution are added to a liquid mixture of the intermediate 3 (5.6 g), 2-hexyl-7-bromo-9,9-dihexylfluorene (3.0 g), and tetrahydrofuran (100 ml), and the mixture is refluxed for 10 hours. After the reaction, the reaction liquid is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 2.2 g of [exemplary compound 20] is obtained.

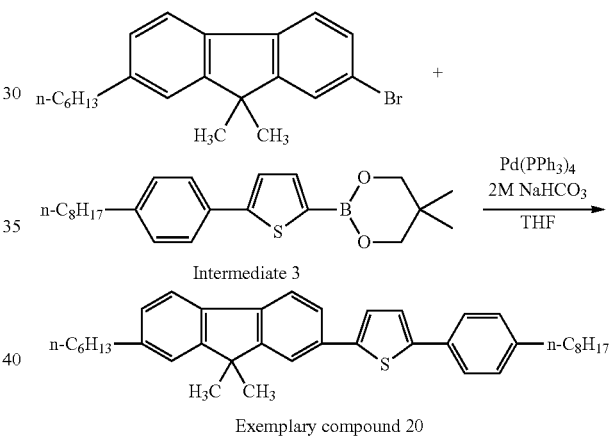

Exemplary compound 20

Identification of the [exemplary compound 20] thus obtained is carried out using $^1$H-NMR spectroscopy ($^1$H-NMR, solvent: CDCl$_3$, UNITY-300 manufactured by VARIAN, Inc., 300 MHz) and IR spectroscopy (Fourier transform infrared spectrometer (FT-730 manufactured by Horiba, Ltd., resolution: 4 cm$^{-1}$) by a KBr method).

Synthesis Example 2

<Synthesis of Exemplary Compound 21>

In the same manner as in Synthesis Example 1, the intermediate 2 (15.0 g) is obtained, and then tetrakis(triphenylphosphine)palladium (1.0 g) and a 2 N aqueous sodium carbonate solution are added to a liquid mixture of the intermediate 2 (15.0 g), 2-thiopheneboronic acid (6.3 g) and tetrahydrofuran (100 ml) in a nitrogen atmosphere. The mixture is refluxed for 35 hours. After the reaction, the reaction liquid is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus an intermediate 4 (7.5 g) is obtained.

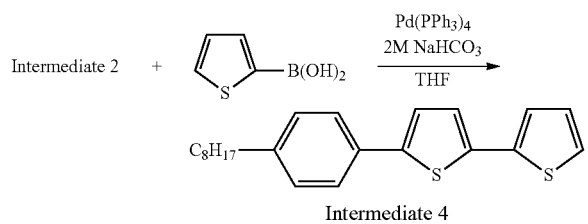

Intermediate 4

Next, the intermediate 4 (7.5 g) is dissolved in N,N-dimethylformamide (100 ml), and N-bromosuccinimide (4.3 g) is added thereto. The mixture is stirred for 18 hours. After the reaction, the mixture is extracted with toluene, and the organic layer is washed with pure water. Subsequently, the organic layer is dried over anhydrous sodium sulfate, and then the solvent is distilled off under reduced pressure. Thus, an intermediate 5 (9.0 g) is obtained.

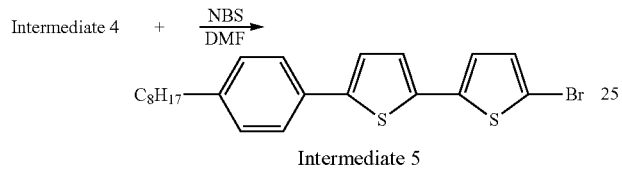

Intermediate 5

Subsequently, n-BuLi (16.3 ml) is put into a three-necked flask, and the flask is cooled to −78° C. in a methanol-dry ice bath under a nitrogen gas stream. An anhydrous tetrahydrofuran (100 ml) solution prepared by dissolving the intermediate 5 (7.5 g) is added dropwise thereto over 10 minutes. The methanol-dry ice bath is removed, and the mixture is warmed and stirred for 2 hours at 35° C.

The mixture is cooled again to −78° C. in a methanol-dry ice bath, and 50 ml of an anhydrous tetrahydrofuran solution of 9.7 g of Tri-n-butyl Borate is added thereto. The mixture is stirred for 5 hours at −78° C. Thereafter, the mixture is stirred for 12 hours at room temperature (25° C.).

2 M HCl (35 ml) is added to the mixture at room temperature (25° C.), and the mixture is stirred for 2 hours at room temperature (25° C.). An organic layer and an aqueous layer are separated, and the aqueous layer is extracted with ether (100 mL). 2,2-Dimethyl-1,3-propanediol (3.5 g) is added to the organic layer, the mixture is stirred, and then anhydrous sodium sulfate is added thereto. Sodium sulfate is separated by filtration, and the solvent is distilled off. Subsequently, unreacted Tri-n-butyl Borate is removed by distillation under reduced pressure, and thus an intermediate 6 (4.5 g) is obtained.

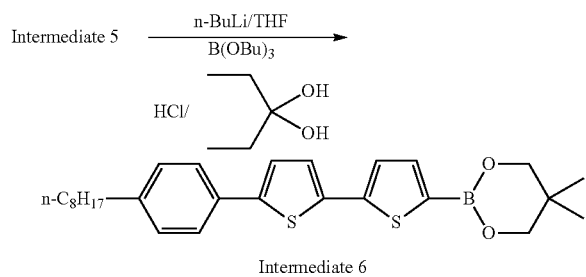

Intermediate 6

Subsequently, tetrakis(triphenylphosphine)palladium (0.5 g) and a 2 N aqueous sodium carbonate solution are added to a liquid mixture of the intermediate 6 (4.5 g), 2-hexyl-7-bromo-9,9-dihexylfluorene (2.8 and tetrahydrofuran (100 ml), and the mixture is refluxed for 20 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 0.7 g of [exemplary compound 21] is obtained.

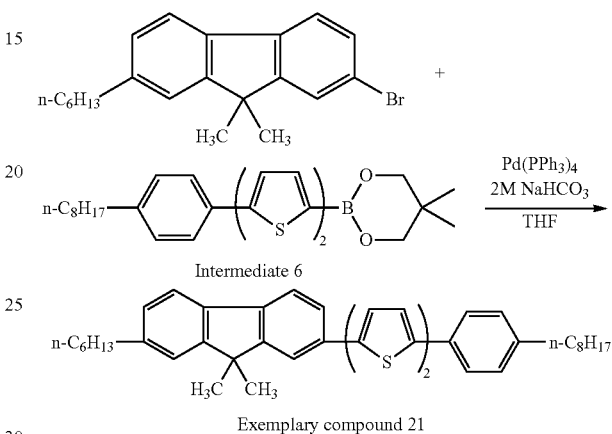

Exemplary compound 21

Identification of the [exemplary compound 21] thus obtained is carried out using $^1$H-NMR spectroscopy and infrared absorption spectroscopy in the same manner as in Synthesis Example 1.

Synthesis Example 3

<Synthesis of Exemplary Compound 23>

In a nitrogen atmosphere, 4-bromophenol (25.0 g), potassium carbonate (21.7 g), and tetrabutylammonium bromide (2.3 g) are dissolved in methyl ethyl ketone (100 ml), and then a mixed solution prepared by dissolving 1-bromooctane (30.7 g) in methyl ethyl ketone (15 ml) is added dropwise thereto. The mixture is stirred for 5 hours, and then the organic layer is washed with pure water. Subsequently, the organic layer is dried over anhydrous sodium sulfate, and then the solvent is distilled off under reduced pressure. The residue is separated by silica gel column chromatography (hexane), and thus an intermediate 7 (42.5 g) is obtained.

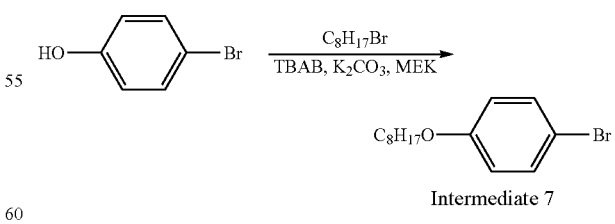

Intermediate 7

Subsequently, in a nitrogen atmosphere, tetrakis(triphenylphosphine)palladium (1.2 g) and a 2 N aqueous sodium carbonate solution are added to a liquid mixture of the intermediate 7 (15.0 g), 2-thiopheneboronic acid (7.3 g) and tetrahydrofuran (100 ml), and the mixture is refluxed for 8 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus an intermediate 8 (9.1 g) is obtained.

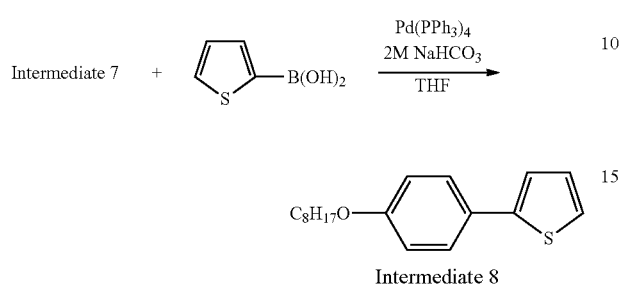

Subsequently, the intermediate 8 (9.1 g) is dissolved in N,N-dimethylformamide (150 ml), N-bromosuccinimide (6.1 g) is added thereto, and the mixture is stirred for 18 hours. After the reaction, the reaction mixture is extracted with toluene, and the organic layer is washed with pure water. Subsequently, the organic layer is dried over anhydrous sodium sulfate, and then the solvent is distilled off under reduced pressure. Thus, an intermediate 9 (8.1 g) is obtained.

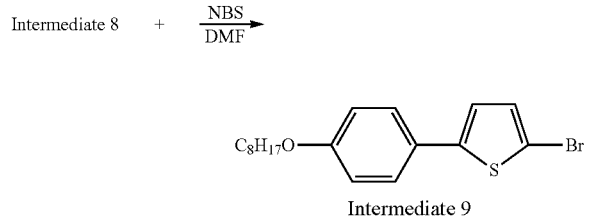

Subsequently, n-BuLi (16.5 ml) is put into a three-necked flask, and the flask is cooled to −78° C. in a methanol-dry ice bath under a nitrogen gas stream. An anhydrous tetrahydrofuran (100 ml) solution prepared by dissolving 8.0 g of the intermediate 9 is added dropwise thereto over 10 minutes. The methanol-dry ice bath is removed, and the mixture is warmed and stirred for 2 hours at 35° C.

The mixture is cooled again to −78° C. in a methanol-dry ice bath, and an anhydrous tetrahydrofuran (50 ml) solution of Tri-n-butyl Borate (9.8 g) is added thereto. The mixture is stirred for 5 hours at −78° C. Thereafter, the mixture is stirred for 12 hours at room temperature (25° C.).

2 M HCl (35 ml) is added to the mixture at room temperature (25° C.), and the mixture is stirred for 2 hours at room temperature (25° C.). An organic layer and an aqueous layer are separated, and the aqueous layer is extracted with ether (100 ml). 2,2-Dimethyl-1,3-propanediol (3.8 g) is added to the organic layer, the mixture is stirred, and then anhydrous sodium sulfate is added thereto. Sodium sulfate is separated by filtration, and the solvent is distilled off. Subsequently, unreacted Tri-n-butyl Borate is removed by distillation under reduced pressure, and thus an intermediate 10 (4.8 g) is obtained.

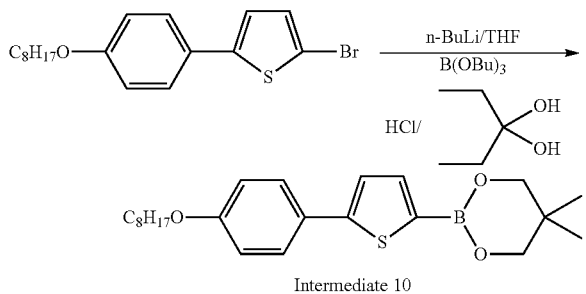

Subsequently, tetrakis(triphenylphosphine)palladium (2.1 g) and a 2 N aqueous sodium carbonate solution are added to a liquid mixture of the intermediate 10 (4.8 g), 2-hexyl-7-bromo-9,9-dihexylfluorene (2.8 g) and tetrahydrofuran (100 ml), and the mixture is refluxed for 8 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 1.8 g of an [exemplary compound 23] is obtained.

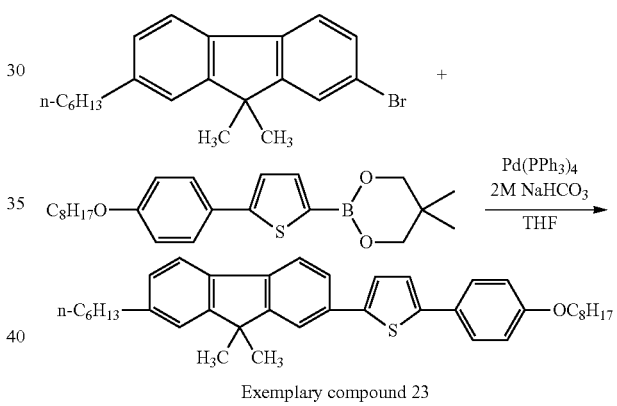

Identification of the [exemplary compound 23] thus obtained is carried out using $^1$H-NMR spectroscopy and infrared absorption spectroscopy in the same manner as in Synthesis Example 1.

Synthesis Example 4

<Synthesis of Exemplary Compound 28>

In the same manner as in Synthesis Example 2, the intermediate 6 (10.0 g) is obtained, and then in a nitrogen atmosphere, tetrakis(triphenylphosphine)palladium (0.8 g) and a 2 N aqueous sodium carbonate solution are added to a liquid mixture of the intermediate 6 (10.0 g) 2-thiopheneboronic acid (3.9 g) and tetrahydrofuran (100 ml), and the mixture is refluxed for 50 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (toluene), and thus an intermediate 11 (7.8 g) is obtained.

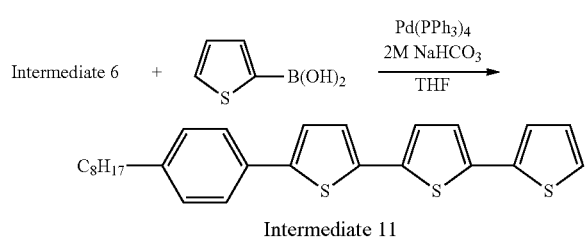

Intermediate 11

Subsequently, the intermediate 11 (7.8 g) is dissolved in N,N-dimethylformamide (300 ml), N-bromosuccinimide (35 g) is added thereto, and the mixture is stirred for 18 hours. After the reaction, the reaction mixture is extracted with toluene, and the organic layer is washed with pure water. Subsequently, the organic layer is dried over anhydrous sodium sulfate, and then the solvent is distilled off under reduced pressure. Thus, an intermediate 12 (6.3 g) is obtained.

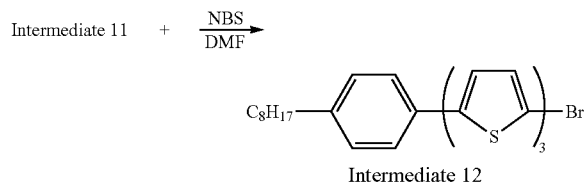

Intermediate 12

Subsequently, n-BuLi (14.5 ml) is put into a three-necked flask, and the flask is cooled to −78° C. in a methanol-dry ice bath under a nitrogen gas stream. An anhydrous tetrahydrofuran (100 ml) solution prepared by dissolving the intermediate 5 (6.3 g) is added dropwise thereto over 10 minutes. The methanol-dry ice bath is removed, and the mixture is warmed and stirred for 2 hours at 35° C.

The mixture is cooled again to −78° C. in a methanol-dry ice bath, and an anhydrous tetrahydrofuran (50 ml) solution of Tri-n-butyl Borate (8.5 g) is added thereto. The mixture is stirred for 5 hours at −78° C. Thereafter, the mixture is stirred for 12 hours at room temperature (25° C.).

2 M HCl (30 ml) is added to the mixture at room temperature (25° C.), and the mixture is stirred for 2 hours at room temperature (25° C.). An organic layer and an aqueous layer are separated, and the aqueous layer is extracted with ether (100 ml) 2,2-Dimethyl-1,3-propanediol (3.3 g) is added to the organic layer, the mixture is stirred, and then anhydrous sodium sulfate is added thereto. Sodium sulfate is separated by filtration, and the solvent is distilled off. Subsequently, unreacted Tri-n-butyl Borate is removed by distillation under reduced pressure, and thus an intermediate 13 (4.1 g) is obtained.

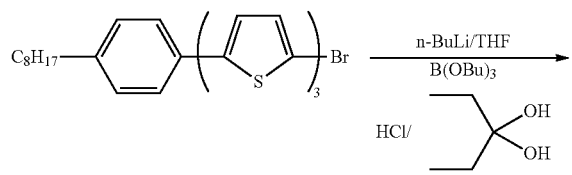

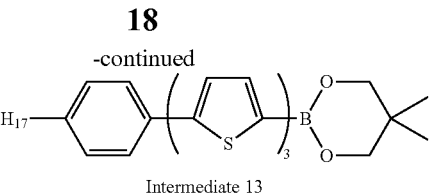

Intermediate 13

Subsequently, tetrakis(triphenylphosphine)palladium (0.6 g) and a 2 N aqueous sodium carbonate solution are added to a liquid mixture of the intermediate 13 (4.1 g), 2-hexyl-7-bromo-9,9-dihexylfluorene (2.0 g) and tetrahydrofuran (100 ml), and the mixture is refluxed for 12 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (toluene), recrystallization is performed with a mixed solvent of isopropyl alcohol and toluene, and thus 1.2 g of an [exemplary compound 28] is obtained.

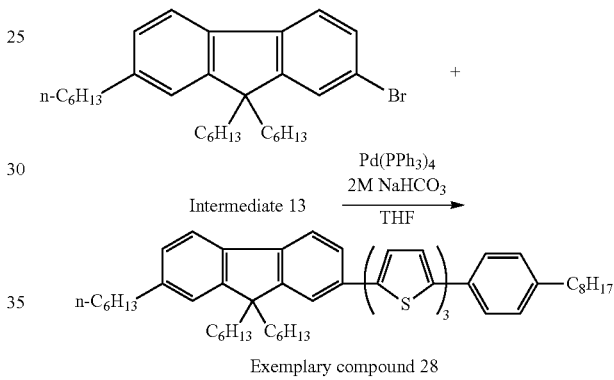

Exemplary compound 28

Furthermore, identification of the [exemplary compound 28] thus obtained is carried out by using $^1$H-NMR spectroscopy and infrared absorption spectroscopy in the same manner as in Synthesis Example 1.

Synthesis Example 5

<Synthesis of Exemplary Compound 30>

According to the following scheme, tetrakis(triphenylphosphine)palladium (2.3 g) and a 2 N aqueous sodium carbonate solution (10 ml) are added to a liquid mixture of 1-bromo-4-tert-butylbenzene (19.8 g), 2-thiopheneboronic acid (10.8 g), and tetrahydrofuran (100 ml) in a nitrogen atmosphere, and the mixture is refluxed for 10 hours. After the reaction, the reaction liquid is extracted with toluene, and the organic phase is washed with pure water. Subsequently, the organic phase is dried over anhydrous sodium sulfate, and then the solvent is distilled off under reduced pressure. The residue is separated by silica gel column chromatography (hexane), and thus an intermediate 14 (23.7 g) is obtained.

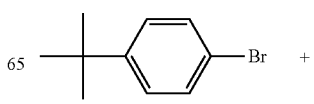

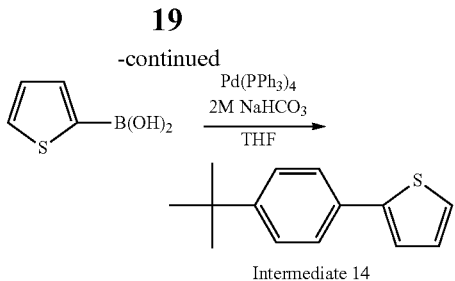

Intermediate 14

Subsequently, according to the following scheme, the intermediate 14 (23.0 g) is dissolved in N,N-dimethylformamide (100 ml), N-bromosuccinimide (16.8 g) is added thereto, and the mixture is stirred for 18 hours. After the reaction, the reaction mixture is extracted with toluene, and the organic phase is washed with pure water. Subsequently, the organic phase is dried over anhydrous sodium sulfate, and then the solvent is distilled off under reduced pressure. Thus, an intermediate 15 (22.8 g) is obtained.

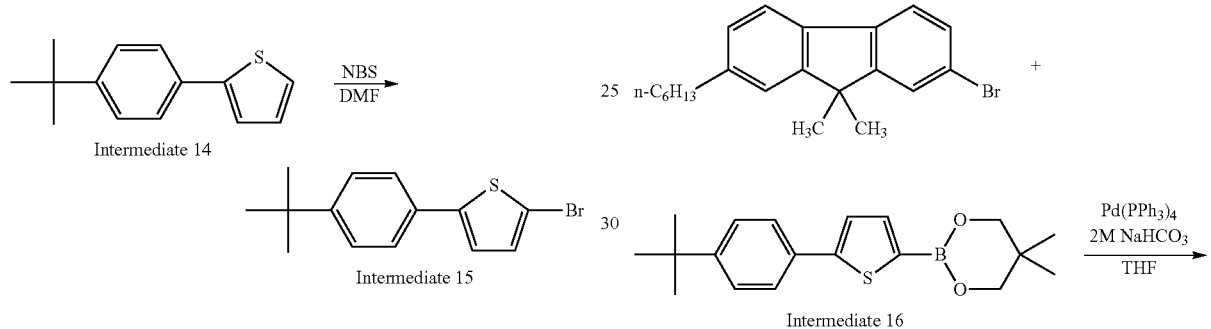

Subsequently, n-BuLi (65 ml) is put into a three-necked flask, and the flask is cooled to −78° C. in a methanol-dry ice bath under a nitrogen gas stream. An anhydrous tetrahydrofuran (100 ml) solution prepared by dissolving the intermediate 15 (20.0 g) is added dropwise thereto over 10 minutes. The methanol-dry ice bath is removed, and the mixture is warmed and stirred for 2 hours at 35° C.

The mixture is cooled again to −78° C. in a methanol-dry ice bath, and an anhydrous tetrahydrofuran (50 ml) solution of Tri-n-butyl Borate (38.6 g) is added thereto. The mixture is stirred for 4 hours at −78° C. Thereafter, the mixture is stirred for 12 hours at room temperature (25° C.).

2 M HCl (135 ml) is added to the mixture at room temperature (25° C.), and the mixture is stirred for 2 hours at room temperature (25° C.). An organic layer and an aqueous layer are separated, and the aqueous layer is extracted with ether (100 ml). 2,2-Dimethyl-1,3-propanediol (12.5 g) is added to the organic layer, the mixture is stirred, and then anhydrous sodium sulfate is added thereto. Sodium sulfate is separated by filtration, and the solvent is distilled off. Subsequently, unreacted Tri-n-butyl Borate is removed by distillation under reduced pressure, and thus an intermediate 16 (16.2 g) is obtained.

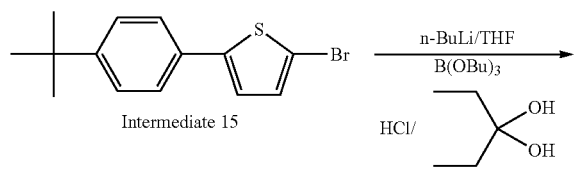

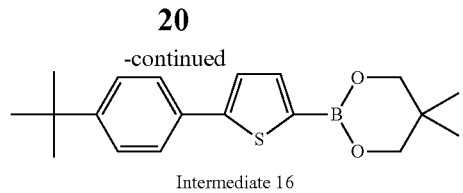

Intermediate 16

Subsequently, tetrakis(triphenylphosphine)palladium (2.4 g) and a 2 N aqueous sodium carbonate solution are added to a liquid mixture of the intermediate 16 (4.3 g), 2-hexyl-7-bromo-9,9-dihexylfluorene (3.0 g) and tetrahydrofuran (100 ml), and the mixture is refluxed for 10 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 1.8 g of an [exemplary compound 30] is obtained.

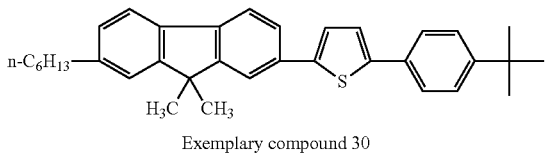

Exemplary compound 30

Identification of the [exemplary compound 30] thus obtained is carried out using $^1$H-NMR spectroscopy ($^1$H-NMR, solvent: CDCl$_3$, UNITY-300 manufactured by VARIAN, Inc., 300 MHz) and IR spectroscopy (Fourier transform infrared spectrometer (FT-730 manufactured by Horiba, Ltd., resolution: 4 cm$^{-3}$) by a KBr method).

Synthesis Example 6

<Synthesis of Exemplary Compound 29>

Subsequently, the intermediate 6 is synthesized in the same manner as in Example 2, tetrakis(triphenylphosphine)palladium (0.5 g) and a 2 N aqueous sodium carbonate solution are added to a liquid mixture of the intermediate 6 (5.2 g), 9,9-dioctylfluorene-2,7-diboronic acid (2.0 g) and tetrahydrofuran (100 ml), and the mixture is refluxed for 20 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 0.7 g of an [exemplary compound 29] is obtained.

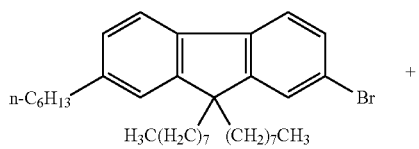

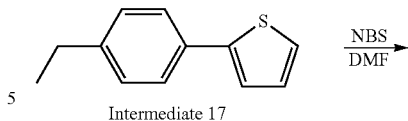

Intermediate 17

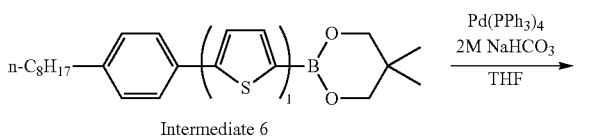

Intermediate 6

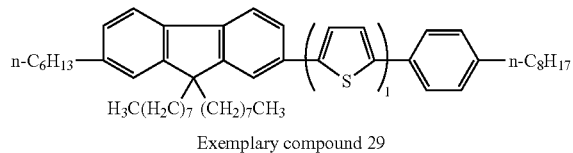

Exemplary compound 29

Intermediate 18

Identification of the [exemplary compound 29] thus Obtained is carried out using $^1$H-NMR spectroscopy and infrared absorption spectroscopy in the same manner as in Synthesis Example 1.

Subsequently, n-BuLi (65 ml) is put into a three-necked flask, and the flask is cooled to −78° C. in a methanol-dry ice bath under a nitrogen gas stream. An anhydrous tetrahydrofuran (100 ml) solution prepared by dissolving the intermediate 18 (18.0 g) is added dropwise thereto over 10 minutes. The methanol-dry ice bath is removed, and the mixture is warmed and stirred for 2 hours at 35° C.

Synthesis Example 7

The mixture is cooled again to −78° C. in a methanol-dry ice bath, and an anhydrous tetrahydrofuran (50 ml) solution of Tri-n-butyl Borate (38.6 g) is added thereto. The mixture is stirred for 4 hours at −78° C. Thereafter, the mixture is stirred for 12 hours at room temperature (25° C.).

<Synthesis of Exemplary Compound 31>

According to the following scheme, tetrakis(triphenylphosphine)palladium (2.3 g) and a 2 N aqueous sodium carbonate solution (10 ml) are added to a liquid mixture of 1-bromo-4-ethylbenzene (23.5 g), 2-thiopheneboronic acid (10.8 g), and tetrahydrofuran (100 ml) in a nitrogen atmosphere, and the mixture is refluxed for 10 hours. After the reaction, the reaction liquid is extracted with toluene, and the organic phase is washed with pure water. Subsequently, the organic phase is dried over anhydrous sodium sulfate, and then the solvent is distilled off under reduced pressure. The residue is separated by silica gel column chromatography (hexane), and thus an intermediate 17 (24.1 g) is obtained.

2 M HCl (135 ml) is added to the mixture at room temperature (25° C.), and the mixture is stirred for 2 hours at room temperature (25° C.). An organic layer and an aqueous layer are separated, and the aqueous layer is extracted with ether (100 ml). 2,2-Dimethyl-1,3-propanediol (12.5 g) is added to the organic layer, the mixture is stirred, and then anhydrous sodium sulfate is added thereto. Sodium sulfate is separated by filtration, and the solvent is distilled off. Subsequently, unreacted Tri-n-butyl Borate is removed by distillation under reduced pressure, and thus an intermediate 19 (16.5 g) is obtained.

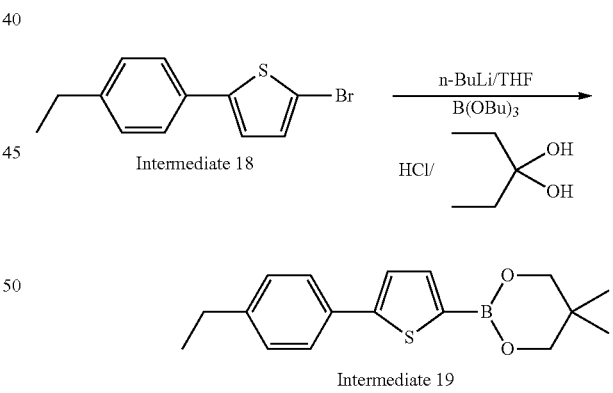

Intermediate 18

Intermediate 19

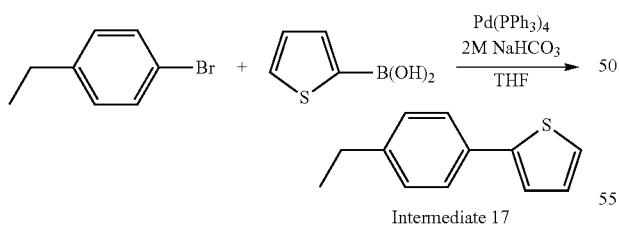

Intermediate 17

Subsequently, according to the following scheme, the intermediate 17 (20 g) is dissolved in N,N-dimethylformamide (100 ml), N-bromosuccinimide (17.5 g) is added thereto, and the mixture is stirred for 18 hours. After the reaction, the reaction mixture is extracted with toluene, and the organic phase is washed with pure water. Subsequently, the organic phase is dried over anhydrous sodium sulfate, and then the solvent is distilled off under reduced pressure. Thus, an intermediate 18 (18.4 g) is obtained.

Subsequently, tetrakis(triphenylphosphine)palladium (2.4 g) and a 2 N aqueous sodium carbonate solution are added to a liquid mixture of the intermediate 19 (4.8 g), 2-hexyl-7-bromo-9,9-dihexylfluorene (3.0 g) and tetrahydrofuran (100 ml), and the mixture is refluxed for 10 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 1.8 g of an [exemplary compound 31] is obtained.

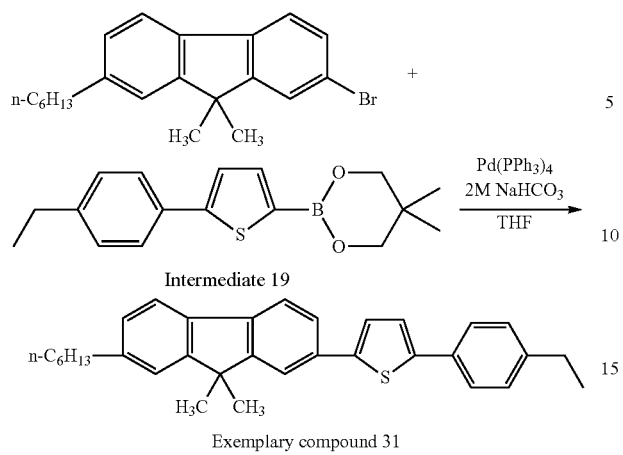

Exemplary compound 31

Identification of the [exemplary compound 31] thus obtained is carried out using ¹H-NMR spectroscopy (¹H-NMR, solvent: CDCl₃, UNITY-300 manufactured by VARIAN, Inc., 300 MHz) and IR spectroscopy (Fourier transform infrared spectrometer (FT-730 manufactured by Horiba, Ltd., resolution: 4 cm$^{-1}$) by a KBr method).

Synthesis Example 8

<Synthesis of Exemplary Compound 32>

According to the following scheme, tetrakis(triphenylphosphine)palladium (2.3 g) and a 2 N aqueous sodium carbonate solution (10 ml) are added to a liquid mixture of 1-bromo-4-decylbenzene (28.5 g), 2-thiopheneboronic acid (10.8 g), and tetrahydrofuran (100 ml) in a nitrogen atmosphere, and the mixture is refluxed for 10 hours. After the reaction, the reaction liquid is extracted with toluene, and the organic phase is washed with pure water. Subsequently, the organic phase is dried over anhydrous sodium sulfate, and then the solvent is distilled off under reduced pressure. The residue is separated by silica gel column chromatography (hexane), and thus an intermediate 20 (24.8 g) is obtained.

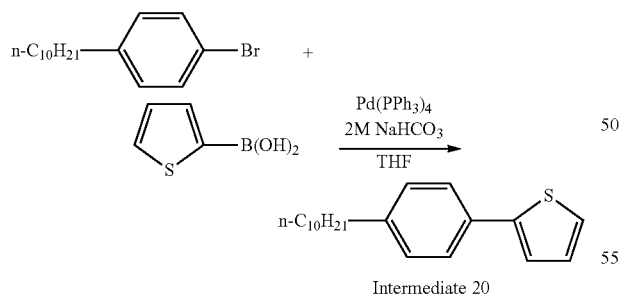

Intermediate 20

Subsequently, according to the following scheme, the intermediate 20 (20 g) is dissolved in N,N-dimethylformamide (100 ml), N-bromosuccinimide (17.5 g) is added thereto, and the mixture is stirred for 18 hours. After the reaction, the reaction mixture is extracted with toluene, and the organic phase is washed with pure water. Subsequently, the organic phase is dried over anhydrous sodium sulfate, and then the solvent is distilled off under reduced pressure. Thus, an intermediate 21 (19.4 g) is obtained.

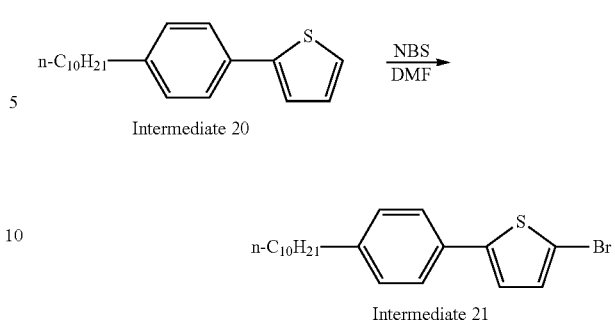

Subsequently, n-BuLi (65 ml) is put into a three-necked flask, and the flask is cooled to −78° C. in a methanol-dry ice bath under a nitrogen gas stream. An anhydrous tetrahydrofuran (100 ml) solution prepared by dissolving the intermediate 21 (19.0 g) is added dropwise thereto over 10 minutes. The methanol-dry ice bath is removed, and the mixture is warmed and stirred for 2 hours at 35° C.

The mixture is cooled again to −78° C. in a methanol-dry ice bath, and an anhydrous tetrahydrofuran (50 ml) solution of Tri-n-butyl Borate (38.6 g) is added thereto. The mixture is stirred for 4 hours at −78° C. Thereafter, the mixture is stirred for 12 hours at room temperature (25° C.).

2 M HCl (135 ml) is added to the mixture at room temperature (25° C.), and the mixture is stirred for 2 hours at room temperature (25° C.). An organic layer and an aqueous layer are separated, and the aqueous layer is extracted with ether (100 ml). 2,2-Dimethyl-1,3-propanediol (12.5 g) is added to the organic layer, the mixture is stirred, and then anhydrous sodium sulfate is added thereto. Sodium sulfate is separated by filtration, and the solvent is distilled off. Subsequently, unreacted Tri-n-butyl Borate is removed by distillation under reduced pressure, and thus an intermediate 22 (15.7 g) is obtained.

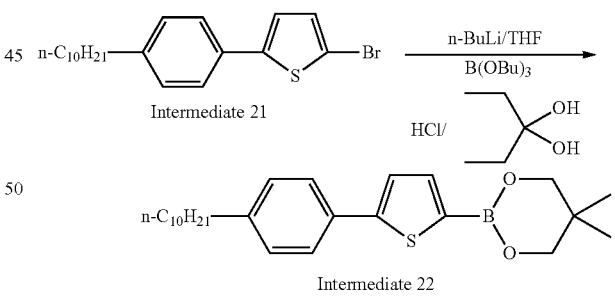

Subsequently, tetrakis(triphenylphosphine)palladium (2.4 g) and a 2 N aqueous sodium carbonate solution are added to a liquid mixture of the intermediate 22 (5.8 g), 2-hexyl-7-bromo-9,9-dihexylfluorene (3.0 g) and tetrahydrofuran (100 ml), and the mixture is refluxed for 10 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 1.6 g of an [exemplary compound 32] is obtained.

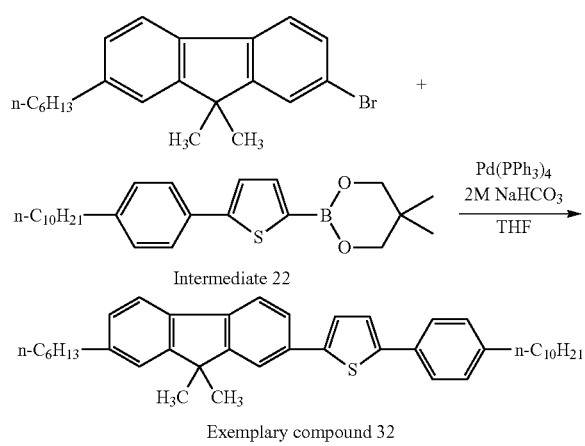

Exemplary compound 32

Identification of the [exemplary compound 32] thus obtained is carried out using $^1$H-NMR spectroscopy ($^1$H-NMR, solvent: CDCl$_3$, UNITY-300 manufactured by VARIAN, Inc., 300 MHz) and IR spectroscopy (Fourier transform infrared spectrometer (FT-730 manufactured by Horiba, Ltd., resolution: 4 cm$^{-1}$) by a KBr method).

Synthesis Example 9

<Synthesis of Exemplary Compound 33>

Subsequently, tetrakis(triphenylphosphine)palladium (2.4 g) and a 2 N aqueous sodium carbonate solution are added to a liquid mixture of the intermediate 22 (5.6 g), 2-ethyl-7-bromo-9,9-dihexylfluorene (3.2 g) and tetrahydrofuran (100 ml), and the mixture is refluxed for 10 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 2.1 g of an [exemplary compound 33] is obtained.

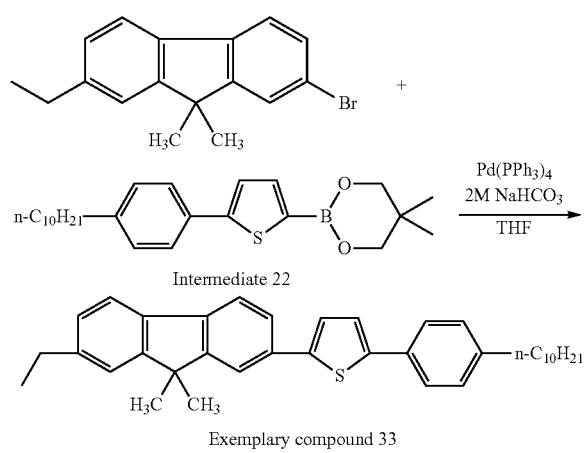

Exemplary compound 33

Identification of the [exemplary compound 33] thus obtained is carried out using $^1$H-NMR spectroscopy ($^1$H-NMR, solvent: CDCl$_3$, UNITY-300 manufactured by VARIAN, Inc., 300 MHz) and IR spectroscopy (Fourier transform infrared spectrometer (FT-730 manufactured by Horiba, Ltd., resolution: 4 cm$^{-1}$) by a KBr method).

Synthesis Example 9

<Synthesis of Exemplary Compound 34>

Subsequently, tetrakis(triphenylphosphine)palladium (2.4 g) and a 2 N aqueous sodium carbonate solution are added to a liquid mixture of the intermediate 3 (6.0 g), 2-decyl-7-bromo-9,9-dihexylfluorene (3.0 g) and tetrahydrofuran (100 ml), and the mixture is refluxed for 10 hours. After the reaction, the mixture is extracted with toluene, and the organic layer is washed with pure water. Subsequently, the organic layer is dried over anhydrous sodium sulfate, and then the solvent is distilled off under reduced pressure. The residue is separated by silica gel column chromatography (hexane), and thus 2.1 g of an [exemplary compound 34] is obtained.

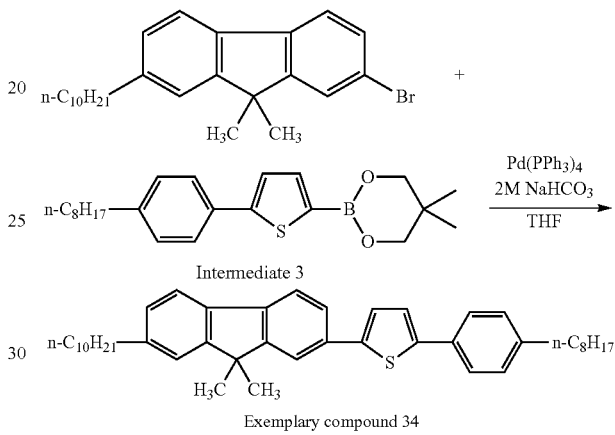

Exemplary compound 34

Identification of the [exemplary compound 34] thus obtained is carried out using $^1$H-NMR spectroscopy ($^1$H-NMR, solvent: CDCl$_2$, UNITY-300 manufactured by VARIAN, Inc., 300 MHz) and IR spectroscopy (Fourier transform infrared spectrometer (FT-730 manufactured by Horiba, Ltd., resolution: 4 cm$^{-1}$) by a KBr method).

Example 1

A silicon substrate having an electrical resistivity of $7 \times 10^{-3}$ Ω·cm is also used as a gate electrode, and a thermal SiO$_2$ film having a thickness of 200 nm is formed thereon as an insulating film. Subsequently, the silicon substrate on which an insulating film has been formed is ultrasonically washed for 5 minutes in acetone for electronic industry, is ultrasonically washed for 5 minutes in 2-propanol for electronic industry, and is dried with dry nitrogen. Subsequently, the substrate is irradiated with UV-ozone for 15 minutes to clean the surface of the insulating film. Thereafter, the silicon substrate on which an insulating film has been formed is exposed to the vapor of 1,1,1,3,3,3-hexamethyldisilazane (manufactured by Sigma-Aldrich Co.), and then is dried with dry nitrogen.

Subsequently, the exemplary compound 20 is dissolved in toluene for electronic industry at a concentration of 0.4% by weight, and this solution is applied on the cleaned silicon substrate (insulating film) by a spin coating method (20 seconds at 2000 rpm), naturally dried, and then heated for 1 minute at 100° C. in a nitrogen atmosphere to form an organic semiconductor layer. The thickness of the organic semiconductor layer thus obtained is 85 nm.

Next, gold (Au) is deposited to a thickness of 60 nm on the organic semiconductor layer by vacuum deposition (degree of vacuum $2\times10^{-4}$ Pa) using a metal mask to form a source electrode and a drain electrode. Thus, an organic semiconductor transistor is produced. The channel length from the source electrode to the drain electrode is set to 1.5 mm, and the channel width is set to 50 μm.

The organic semiconductor transistor thus produced exhibits the characteristics of a p-type transistor.

<Evaluation>

(Evaluation of Solubility and Film-Forming Property)

In regard to the surface of the organic semiconductor layer formed with a solution prepared by dissolving the exemplary compound 20 in toluene, the occurrence of defects such as cracks, fissures or chips is observed under an optical microscope in an area range of 1 mm×1 mm to evaluate solubility and the film-forming property. The results are shown in Table 1. The evaluation criteria are as follows. Also, the film-forming property is also evaluated by changing the solvent from toluene to tetrahydrofuran, xylene, dichloroethane or chloroform.

Evaluation Criteria for Solubility and Film-Forming Property

The judgment is made by using a magnifying glass, and the properties are evaluated based on the following evaluation criteria.

A: The substrate is entirely covered with the film and the state is satisfactory.

B: There are some areas that are not covered with the film.

C: There are many areas that are not covered with the film.

(Evaluation of Charge Mobility)

For the transistors immediately after production, the charge mobility is determined from the saturation region of the current-voltage characteristics. Furthermore, the transistors are stored at 25° C., and after a lapse of one month, the transistor characteristics are evaluated again to measure the charge mobility. The results are shown in Table 1.

Examples 2 to 10

Organic semiconductor transistors are produced in the same manner as in Example 1, except that the exemplary compound 21, exemplary compound 23, exemplary compound 28, exemplary compound 29, exemplary compound 30, exemplary compound 31, exemplary compound 32, exemplary compound 33, and exemplary compound 34 are used instead of the exemplary compound 20 used in the formation of the organic semiconductor layer in Example 1. The organic semiconductor transistors thus obtained are evaluated by the same method as in Example 1.

Comparative Example 1

An organic semiconductor transistor is produced in the same manner as in Example 1, except that 13,6-N-sulfinylacetamidopentacene (manufactured by Sigma-Aldrich Co.) is used as a comparative compound 1 instead of the exemplary compound 20 used in Example 1, and the heating temperature is set to 160° C. Thus, the organic semiconductor transistor is evaluated as Comparative Example 1.

Comparative Example 2

An organic semiconductor transistor is produced in the same manner as in Example 1, except that poly(3-hexylthiophene) (manufactured by Sigma-Aldrich Co.) is used as a comparative compound 2 instead of 13,6-N-sulfinylacetamidopentacene used in Comparative Example 1, and chloroform is used as the solvent. Thus, the organic semiconductor transistor is evaluated as Comparative Example 2.

Comparative Example 3

An organic semiconductor transistor is produced in the same manner as in Example 1, except that a compound represented by the following structural formula (II) is used as a comparative compound 3 instead of 13,6-N-sulfinylacetamidopentacene used in Comparative Example 1. Thus, the organic semiconductor transistor is evaluated as Comparative Example 3.

Structural formula (II)

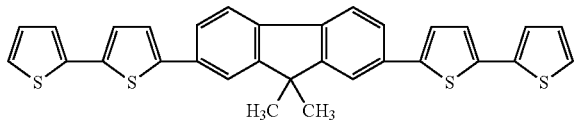

Comparative Example 4

An organic semiconductor transistor is produced in the same manner as in Example 1, except that a compound represented by the following structural formula (III) is used as a comparative compound 4 instead of 13,6-N-sulfinylacetamidopentacene used in Comparative Example 1. Thus, the organic semiconductor transistor is evaluated as Comparative Example 4.

Structural formula (III)

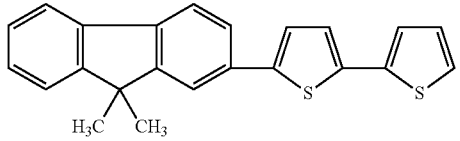

The organic semiconductor transistors of Comparative Examples 1 to 4 are evaluated by the same method as in Example 1. The results are shown in Table 1.

TABLE 1

| Example | Exemplary compound or comparative compound | Solubility/film-forming property | | | | | Charge mobility (cm$^2$/Vs) | |
|---|---|---|---|---|---|---|---|---|
| | | Toluene | Tetrahydrofuran | Dichloroethane | Xylene | Chloroform | Immediately after production | One month after production |
| Example 1 | Exemplary compound 20 | A | A | A | A | A | $8.83 \times 10^{-4}$ | $6.17 \times 10^{-4}$ |
| Example 2 | Exemplary compound 21 | A | A | A | A | A | $9.58 \times 10^{-4}$ | $5.45 \times 10^{-4}$ |

TABLE 1-continued

| Example | Exemplary compound or comparative compound | Solubility/film-forming property | | | | | Charge mobility ($cm^2/Vs$) | |
|---|---|---|---|---|---|---|---|---|
| | | Toluene | Tetrahydrofuran | Dichloroethane | Xylene | Chloroform | Immediately after production | One month after production |
| Example 3 | Exemplary compound 23 | A | A | A | A | A | $1.85 \times 10^{-3}$ | $8.12 \times 10^{-4}$ |
| Example 4 | Exemplary compound 28 | A | A | A | A | A | $2.15 \times 10^{-3}$ | $7.58 \times 10^{-4}$ |
| Example 5 | Exemplary compound 29 | A | A | A | A | A | $1.61 \times 10^{-3}$ | $8.28 \times 10^{-4}$ |
| Example 6 | Exemplary compound 30 | A | A | A | A | A | $1.11 \times 10^{-3}$ | $7.38 \times 10^{-4}$ |
| Example 7 | Exemplary compound 31 | A | A | A | A | A | $9.78 \times 10^{-4}$ | $4.52 \times 10^{-4}$ |
| Example 8 | Exemplary compound 32 | A | A | A | A | A | $8.98 \times 10^{-4}$ | $5.85 \times 10^{-4}$ |
| Example 9 | Exemplary compound 33 | A | A | A | A | A | $1.08 \times 10^{-3}$ | $6.84 \times 10^{-4}$ |
| Example 10 | Exemplary compound 34 | A | A | A | A | A | $8.28 \times 10^{-4}$ | $5.59 \times 10^{-4}$ |
| Comp. Ex. 1 | Comparative compound 1 | B | A | A | C | A | $7.5 \times 10^{-4}$ | Not measurable |
| Comp. Ex. 2 | Comparative compound 2 | B | A | A | C | A | $5.5 \times 10^{-4}$ | $9.3 \times 10^{-7}$ |
| Comp. Ex. 3 | Comparative compound 3 | C | C | B | C | B | $3.5 \times 10^{-4}$ | $8.5 \times 10^{-7}$ |
| Comp. Ex. 4 | Comparative compound 4 | C | C | B | C | B | $2.5 \times 10^{-4}$ | Not measurable |

From the results of Table 1, it can be seen that the organic semiconductor layers of the Examples have excellent solubility and film-forming property as compared with the organic semiconductor layers of the Comparative Examples.

Furthermore, it can be seen that the organic semiconductor transistors of the Examples have high charge mobility immediately after production as compared with the organic semiconductor transistors of the Comparative Examples, and a decrease in the charge mobility is suppressed even one month after production.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An organic semiconductor transistor comprising:
a plurality of electrodes; and
an organic semiconductor layer containing at least one fluorene compound represented by the following formula (I):

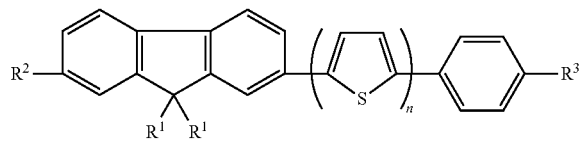

(I)

wherein in the formula (I), $R^1$ represents an alkyl group having from 1 to 8 carbon atoms; $R^2$ and $R^3$ each independently represent an alkyl group having from 1 to 8 carbon atoms, or an alkoxy group having from 1 to 8 carbon atoms; and n represents an integer of from 1 to 3.

2. The organic semiconductor transistor according to claim 1, wherein the plurality of electrodes include a source electrode, a drain electrode and a gate electrode, the organic semiconductor transistor further comprises an insulating layer, the gate electrode is disposed apart from both the source electrode and the drain electrode, the organic semiconductor layer is disposed to be in contact with both the source electrode and the drain electrode, the insulating layer is disposed to be interposed between the organic semiconductor layer and the gate electrode, and the organic semiconductor transistor is a field effect transistor.

3. The organic semiconductor transistor according to claim 1, wherein the plurality of electrodes include a source electrode, a drain electrode and a gate electrode, the source electrode and the drain electrode are disposed to face each other, the gate electrode is disposed apart from both the source electrode and the drain electrode, the organic semiconductor layer is disposed to be in contact with the source electrode and the drain electrode, and the organic semiconductor transistor is a static induction transistor.

* * * * *